United States Patent
Harazono

(10) Patent No.: US 10,172,235 B1
(45) Date of Patent: Jan. 1, 2019

(54) WIRING BOARD AND METHOD FOR MANUFACTURING THE SAME

(71) Applicant: KYOCERA Corporation, Kyoto-shi, Kyoto (JP)

(72) Inventor: Masaaki Harazono, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 16/000,278

(22) Filed: Jun. 5, 2018

(30) Foreign Application Priority Data

Jun. 26, 2017 (JP) .................. 2017-123966

(51) Int. Cl.
*H05K 1/02* (2006.01)
*H05K 1/03* (2006.01)
*H05K 1/11* (2006.01)

(52) U.S. Cl.
CPC .......... *H05K 1/0298* (2013.01); *H05K 1/024* (2013.01); *H05K 1/0242* (2013.01); *H05K 1/0306* (2013.01); *H05K 1/115* (2013.01)

(58) Field of Classification Search
USPC ................................. 361/748, 760
See application file for complete search history.

(56) References Cited

U.S. PATENT DOCUMENTS

2004/0039127 A1* 2/2004 Amou ................. H01B 3/441
525/328.9
2014/0353021 A1* 12/2014 Yugawa ............... H05K 1/115
174/258

FOREIGN PATENT DOCUMENTS

JP 07-176870 A 7/1995

* cited by examiner

*Primary Examiner* — Andargie M Aychillhum
(74) *Attorney, Agent, or Firm* — Volpe and Koenig, P.C.

(57) ABSTRACT

A wiring board includes a laminate in which at least one first insulating layer containing first insulating particles and a first insulating resin, and at least one second insulating layer containing second insulating particles having a particle size smaller than a particle size of the first insulating particles and a second insulating resin are alternately positioned; a groove for wiring positioned at least on an upper surface of the laminate and including a side surface and a bottom surface; a via hole positioned in the first insulating layer of the laminate; and a wiring conductor positioned in the groove for wiring and in the via hole. The bottom surface of the groove for wiring is positioned in the second insulating layer.

4 Claims, 5 Drawing Sheets

WIRING BOARD AND METHOD FOR MANUFACTURING THE SAME

BACKGROUND OF THE INVENTION

1. Field of the Invention

The present disclosure relates to a wiring board including fine wiring.

2. Description of the Related Art

Currently, a wiring board where fine wiring conductors are formed in an insulating layer at high density is developed. Such a wiring board is used for a small and high-performance electronic equipment typified by portable communication equipment, game equipment, and the like.

Japanese Unexamined Patent Application Publication No. 7-176870 is an example of the related art.

SUMMARY OF THE INVENTION

High-frequency transmission signals are increasingly used along with the electronic equipment described above having higher functionality. A high-frequency signal has a characteristic of a so-called skin effect, that is a characteristic of a high-frequency signal mainly propagating on a surface of the wiring conductor. Thus, known is a fact that as a surface of the wiring conductor becomes flat, the transmission characteristic improves. However, as the wiring conductor becomes finer, the surface of the wiring conductor is easily affected by unevenness of the surface of the insulating layer and it is difficult to planarize the surface of the wiring conductor. As a result, a flat surface on which the high frequency signal propagates decreases and it is difficult to efficiently transmit the high frequency signal.

A wiring board according to the present disclosure includes: a laminate in which at least one first insulating layer and at least one second insulating layer are alternately positioned, the at least one first insulating layer containing first insulating particles and a first insulating resin, the at least one second insulating layer containing second insulating particles having a particle size smaller than a particle size of the first insulating particles and a second insulating resin; a groove for wiring positioned at least on an upper surface of the laminate and including a side surface and a bottom surface; a via hole positioned in the first insulating layer of the laminate; and a wiring conductor positioned in the groove for wiring and in the via hole, in which the bottom surface of the groove for wiring is positioned in the second insulating layer.

A method for manufacturing a wiring board according to the present disclosure includes: preparing a first insulating layer containing first insulating particles and a first insulating resin, and a second insulating layer containing second insulating particles having a particle size smaller than a particle size of the first insulating particles and a second insulating resin; forming a laminate by alternately laminating at least one layer of the first insulating layer and at least one layer of the second insulating layer; forming a metal mask including an opening corresponding to a wiring pattern on a surface of the laminate; forming a groove for wiring a bottom surface of which is positioned in the second insulating layer by etching the laminate exposed in the opening; forming a via hole penetrating the first insulating layer from an upper surface to a lower surface of the first insulating layer; and forming a wiring conductor in the groove for wiring and the via hole.

According to the wiring board and the method for manufacturing the wiring board of the present disclosure, the wiring board having a good transmission characteristic of a high frequency signal can be provided.

DESCRIPTION OF THE PREFERRED EMBODIMENTS

Figure 1:
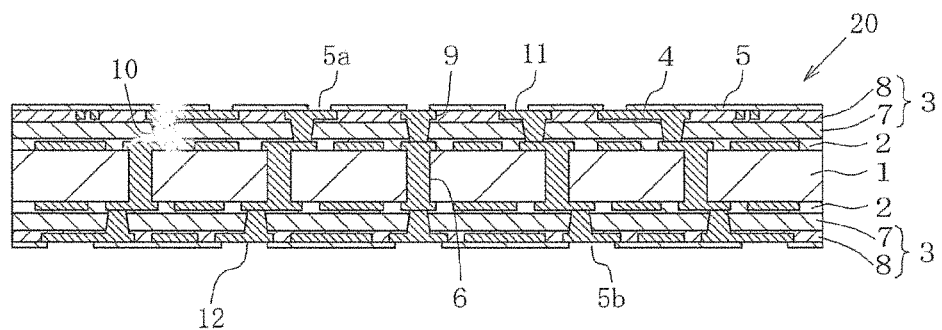
FIG. 1 is a schematic sectional view illustrating an exemplary embodiment of a wiring board of the present disclosure.
Figure 2:
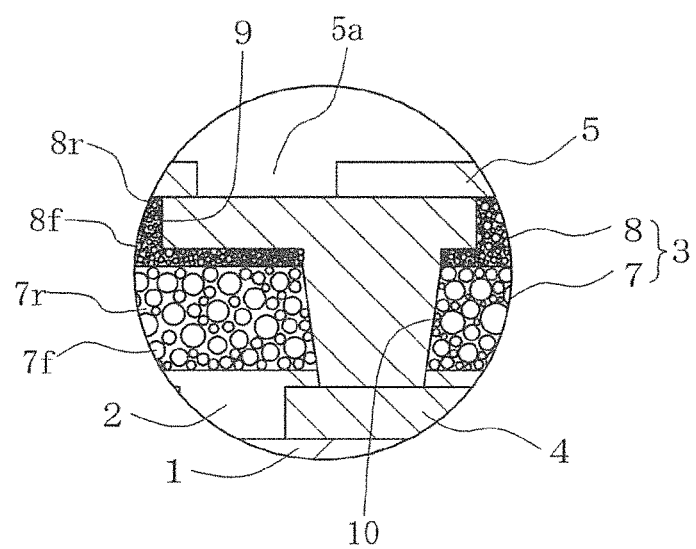
FIG. 2 is an enlarged sectional view of a main portion of the wiring board of the present disclosure.

A wiring board of the present disclosure is described with reference to FIGS. 1 and 2. A wiring board 20 includes a core insulating layer 1, a buildup insulating layer 2, a laminate 3, a wiring conductor 4, and a solder resist 5.

The core insulating layer 1 contains an insulating material in which, for example, a reinforcing glass cloth is impregnated with epoxy resin, bismaleimide triazine resin, or the like. The core insulating layer 1 has a function as a reinforcing support in the wiring board 20. The core insulating layer 1 includes a plurality of through-holes 6 penetrating in a top-bottom direction. A thickness of the core insulating layer 1 is set to, for example, 200 to 850 µm. A diameter of the through-hole 6 is set to, for example, 50 to 200 µm.

The buildup insulating layer 2 contains, for example, an insulating material such as epoxy resin, bismaleimide triazine resin, or polyimide resin. The buildup insulating layer 2 covers the wiring conductor 4 described below on upper and lower surfaces of the core insulating layer 1, and has a function of ensuring insulation between the wiring conductors 4 adjacent to each other. A thickness of the buildup insulating layer 2 is set to, for example, 10 to 40 µm.

The laminate 3 is positioned on the upper surface of the buildup insulating layer 2 on an upper side and on the lower surface of the buildup insulating layer 2 on a lower side. The laminate 3 includes, for example, one first insulating layer 7 and one second insulating layer 8. The laminate 3 includes a groove for wiring 9 and a via hole 10 described below, and has a function of ensuring a region in which the wiring conductor 4 is positioned.

The first insulating layer 7 includes, for example, first insulating particles 7f such as silica and a first insulating resin 7r such as epoxy resin. The first insulating layer 7 is positioned on the upper surface of the buildup insulating layer 2 on the upper side and on the lower surface of the buildup insulating layer 2 on the lower side.

The first insulating particles 7f have, for example, a spherical shape and a particle size is set to, for example, 0.5 to 5 µm in diameter. A content ratio of the first insulating particles 7f is set to, for example, 50 to 80 wt %. A thermal expansion coefficient of the first insulating layer 7 is set to, for example, 18 to 20 ppm/° C. The first insulating layer 7 has the thermal expansion coefficient smaller than a thermal expansion coefficient of the second insulating layer 8 and has a function of maintaining connection reliability, for example, between the wiring conductor 4 in the via hole 10 and the wiring conductor 4 on the upper and lower surfaces of the core insulating layer 1 by suppressing thermal expansion and contraction. Examples of the first insulating resin 7r include, in addition to epoxy resin, for example, polyimide resin, cyanate resin, or the like. Examples of the first insulating particles 7f include, in addition to silica ($SiO_2$), for example, alumina ($AlO_3$), glass, or the like.

The second insulating layer 8 includes, for example, second insulating particles 8f such as silica and a second insulating resin 8r such as epoxy resin. The second insulating layer 8 is positioned on an upper surface of the first insulating layer 7 on the upper side and on a lower surface of the first insulating layer 7 on the lower side.

The second insulating layer 8 includes the groove for wiring 9. A side surface and a bottom surface of the groove for wiring 9 are positioned in the second insulating layer 8. A cross section of the second insulating resin 8r and a cross section of the second insulating particles 8f are positioned to be flush with each other on the side surface of the groove for wiring 9. Therefore, the side surface of the wiring conductor 4 is formed flat. Since the bottom surface of the groove for wiring 9 is positioned in the second insulating layer 8, the bottom surface of the groove for wiring 9 is unlikely to be affected by irregularities caused by the second insulating particles 8f having a small particle size and is unlikely to be affected by irregularities caused by the first insulating particles 7f having a large particle size included in the first insulating layer 7. Accordingly, the bottom surface of the wiring conductor 4 is formed flat.

The via hole 10 is positioned from the bottom surface of the groove for wiring 9 to the surface of the wiring conductor 4 positioned on the upper and lower surfaces of the core insulating layer 1. A diameter of the via hole 10 is set to, for example, 10 to 65 μm.

The second insulating particles 8f have, for example, a spherical shape and a particle size is set to, for example, 0.1 to 1 μm in diameter. A content ratio of the second insulating particles 8f is set to, for example, 30 to 70 wt %. A thermal expansion coefficient of the second insulating layer 8 is set to, for example, 30 to 35 ppm/° C. Since the second insulating layer 8 includes the second insulating particles 8f a particle size of which is smaller than a particle size of the first insulating particles 7f, the second insulating layer 8 has a function of flattening the surface of the wiring conductor 4 by suppressing irregularities of the bottom surface of the groove for wiring 9. Examples of the second insulating resin 8r include, in addition to epoxy resin, for example, polyimide resin, cyanate resin, or the like. Examples of the second insulating particles 8f include, in addition to silica ($SiO_2$), for example, alumina ($AlO_3$), glass, or the like.

As described above, the thermal expansion coefficient of the first insulating layer 7 is set to be smaller than the thermal expansion coefficient of the second insulating layer 8 and is set to a value close to a thermal expansion coefficient of the wiring conductor 4 described below. This is because the particle size of the first insulating particles 7f is larger than the particle size of the second insulating particles 8f, the content ratio of the first insulating particles 7f in the first insulating layer 7 can be made larger than a content ratio of the second insulating particles 8f in the second insulating layer 8. Since such a first insulating layer 7 is positioned close to a connection portion between the wiring conductor 4 positioned on the upper and lower surfaces of the core insulating layer 1 and the wiring conductor 4 positioned in the via hole 10, a difference in thermal expansion and contraction between the first insulating layer 7 and the wiring conductor 4 can be reduced, which is advantageous in suppressing a thermal stress applied to the connection portion during thermal expansion and contraction of the wiring board 20.

The particle size of the second insulating particles 8f is smaller than the particle size of the first insulating particles 7f. Therefore, the bottom surface of the groove for wiring 9 positioned in the second insulating layer 8 is unlikely to be affected by the irregularities caused by the second insulating particles 8f and is also unlikely to be affected by the irregularities caused by the first insulating particles 7f having a large particle size included in the first insulating layer 7, which is advantageous in that the bottom surface is made flat.

The wiring conductor 4 contains, for example, a highly conductive metal such as a copper-plating metal or a copper foil. The wiring conductor 4 is positioned on the upper and lower surfaces of the core insulating layer 1, in the through-hole 6, in the groove for wiring 9, and in the via hole 10. The wiring conductor 4 positioned in the through-hole 6 electrically connects the wiring conductors 4 positioned on the upper and lower surfaces of the core insulating layer 1 to each other. The wiring conductor 4 positioned in the via hole 10 electrically connects the wiring conductor 4 positioned on the upper surface or the lower surface of the core insulating layer 1 and the wiring conductor 4 positioned in the groove for wiring 9. The wiring conductor 4 positioned in the groove for wiring 9 includes a flat upper surface positioned to be flush with the upper surface of the second insulating layer 8. An arithmetic average roughness of the upper surface is set to Ra=0.5 μm or less. An arithmetic average roughness of the side surface is set to Ra=1 μm or less. An arithmetic average roughness of the bottom surface is set to Ra=1 μm or less. A thermal expansion coefficient of the wiring conductor 4 is set to, for example, 17 ppm/° C.

The solder resist 5 contains insulating resin such as epoxy resin or polyimide resin. The solder resist 5 is positioned on the upper surface of the second insulating layer 8 on the upper side and on the lower surface of the second insulating layer 8 on the lower side. The solder resist 5 mainly has a function of protecting the wiring conductor 4 from an external environment. The solder resist 5 on the upper side includes an opening 5a exposing a part of the wiring conductor 4. The wiring conductor 4 exposed in the opening 5a functions as a first pad 11 connectable to an electrode of a semiconductor element. The solder resist 5 on the lower side includes an opening 5b exposing a part of the wiring conductor 4. The wiring conductor 4 exposed in the opening 5b functions as a second pad 12 connectable to an electrode of an external electric board.

As described above, the wiring board 20 of the present disclosure includes the bottom surface of the groove for wiring 9 in the second insulating layer 8 including the second insulating particles 8f having the particle size smaller than the particle size of the first insulating particles 7f. Therefore, the bottom surface of the wiring conductor 4 positioned in the groove for wiring 9 is unlikely to be affected by the irregularities caused by the second insulating particles 8f and is also unlikely to be affected by the irregularities caused by the first insulating particles 7f having a large particle size included in the first insulating layer 7, and accordingly it is easy to form a flat surface. The cross section of the second insulating resin 8r and the cross section of the second insulating particles 8f are positioned to be flush with each other on the side surface of the groove for wiring 9. Therefore, the side surface of the wiring conductor 4 is formed flat. The upper surface of the wiring conductor 4 is also formed flat. Accordingly, the wiring board having a good transmission characteristic of a high frequency signal can be provided.

As described above, the first insulating layer 7 having the thermal expansion coefficient close to the thermal expansion coefficient of the wiring conductor 4 is positioned close to the connection portion between the wiring conductor 4 positioned on the upper and lower surfaces of the core insulating layer 1 and the wiring conductor 4 positioned in the via hole 10. Therefore, the thermal stress applied to the connection portion at the time of thermal expansion and contraction of the wiring board 20 is suppressed, and there is an effect of suppressing occurrence of cracks at the connection portion. If the particle size of the first insulating particles 7f is made small along with the particle size of the second insulating particles 8f, it is difficult to obtain such an effect.

A method for manufacturing a wiring board of the present disclosure is described with reference to FIGS. 4A to 5J. The same reference numerals are given to the same members as those in FIGS. 1 and 2, and detailed description thereof is omitted.

Figure 4A:
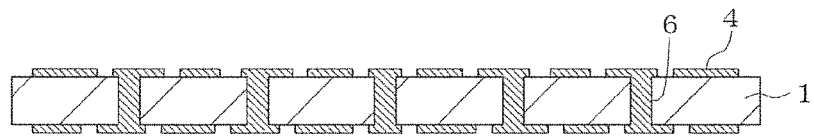
FIGS. 4A to 4E are schematic sectional views illustrating an exemplary embodiment of a method for manufacturing a wiring board of the present disclosure.

First, as illustrated in FIG. 4A, the wiring conductor 4 is formed on the surfaces of the core insulating layer 1 and inside of the through-hole 6. The core insulating layer 1 is formed into a flat plate shape by laminating a plurality of prepregs, in which the reinforcing glass cloth is impregnated with epoxy resin, bismaleimide triazine resin, or the like, and pressing the laminated prepregs under heating. The through-hole 6 is formed by performing processing such as drill processing, laser processing, or blast processing on the core insulating layer 1. The wiring conductor 4 is formed by depositing a copper-plating metal on the surface of the core insulating layer 1 and the inside of the through-hole 6 by, for example, a plating technique such as a semi-additive method. The wiring conductors 4 on the upper and lower surfaces of the core insulating layer 1 are electrically connected to each other via the wiring conductor 4 in the through-hole 6.

Figure 4B:
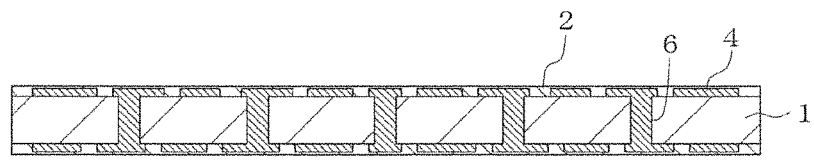

Next, as illustrated in FIG. 4B, the buildup insulating layer 2 is formed on the upper surface and the lower surface of the core insulating layer 1. The buildup insulating layer 2 is formed by coating and thermally curing, for example, a film for the insulating layer containing thermosetting resin such as polyimide resin, epoxy resin, or bismaleimide triazine resin on the upper and lower surfaces of the core insulating layer 1 under vacuum to coat the wiring conductor 4. Insulating particles of silicon oxide or the like may be dispersed in the thermosetting resin.

Figure 4C:
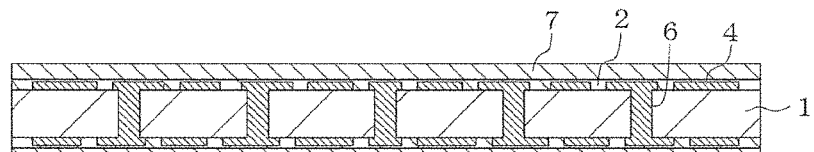

Next, as illustrated in FIG. 4C, the first insulating layer 7 is formed on the upper surface of the buildup insulating layer 2 on the upper side and the lower surface of the buildup insulating layer 2 on the lower side. The first insulating layer 7 is formed by coating and thermally curing a film for the insulating layer in which, for example, silica particles are dispersed in epoxy resin on the upper and lower surfaces of the buildup insulating layer 2 under vacuum.

Figure 4D:
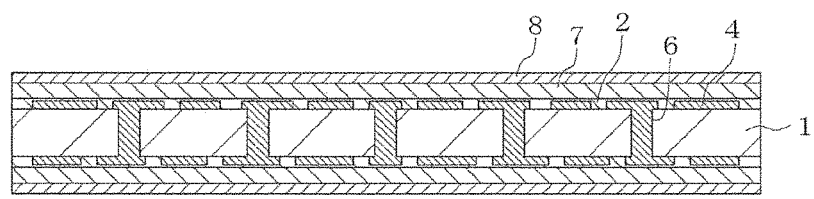

Next, as illustrated in FIG. 4D, the second insulating layer 8 is formed on the upper surface of the first insulating layer 7 on the upper side and the lower surface of the first insulating layer 7 on the lower side. The second insulating layer 8 is formed by coating and thermally curing a film for the insulating layer in which, for example, silica particles are dispersed in epoxy resin, on the upper and lower surfaces of the first insulating layer 7 under vacuum.

Figure 4E:
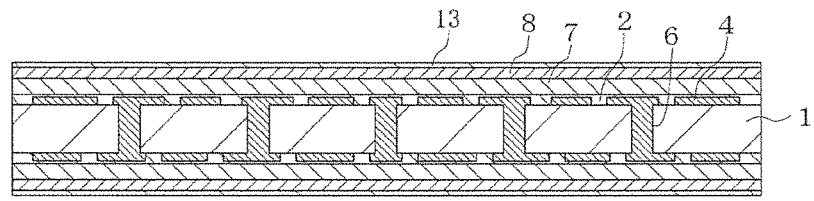

Next, as illustrated in FIG. 4E, a metal film 13 is formed on the upper surface of the second insulating layer 8 on the upper side and the lower surface of the second insulating layer 8 on the lower side. The metal film 13 is formed of a metal such as copper by, for example, using a sputtering technique or an electroless plating technique. A thickness of the metal film 13 is set to, for example, 0.1 to 3 μm.

Figure 5F:
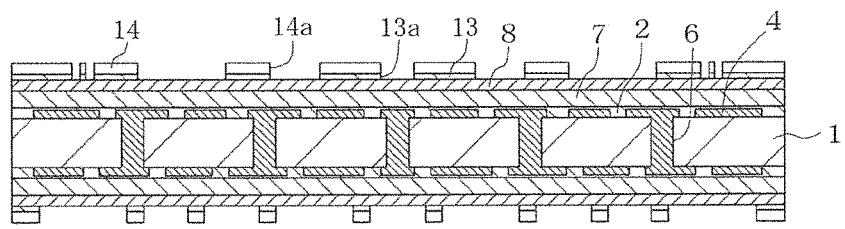
FIGS. 5F to 5J are schematic sectional views illustrating an exemplary embodiment of a method for manufacturing a wiring board of the present disclosure.

Next, as illustrated in FIG. 5F, an etching resist 14 having openings 14a corresponding to a pattern of the groove for wiring 9 is formed on an upper surface of the metal film 13 on the upper side and a lower surface of the metal film 13 on the lower side, and the metal film 13 exposed in the opening 14a is removed by etching. Accordingly, an opening 13a corresponding to the pattern of the groove for wiring 9 is formed in the metal film 13.

Figure 5G:
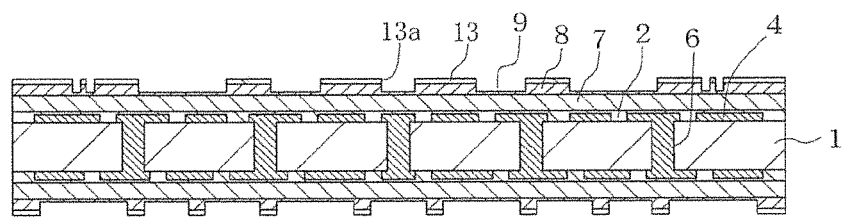

Next, as illustrated in FIG. 5G, the etching resist 14 is removed, and then the groove for wiring 9 is formed in the second insulating layer 8 exposed in the opening 13a. The groove for wiring 9 is formed so that the bottom surface of the groove for wiring 9 is positioned in the second insulating layer 8. Thus, the bottom surface is formed such that the bottom surface is unlikely to be affected by the irregularities caused by the second insulating particles 8f having a relatively small particle size and unlikely to be affected by the irregularities caused by the first insulating particles 7f included in the first insulating layer 7. The cross section of the second insulating resin 8r and the cross section of the second insulating particles 8f are formed so as to be flush with each other on the side surface of the groove for wiring 9. The groove for wiring 9 is formed by, for example, a dry etching process using a mixed gas of carbon tetrafluoride and oxygen. In the dry etching process, the position of the bottom surface of the groove for wiring 9 can be appropriately adjusted by adjusting one or both of a processing time and a processing output. After the dry etching process, in order to remove a deteriorated layer of the second insulating resin 8r generated in the dry etching process, plasma processing, removal processing with an alkaline solution, or the like may be performed. An adhesion force between the wiring conductor 4 and the groove for wiring 9 is improved by removing the deteriorated layer.

Figure 5H:
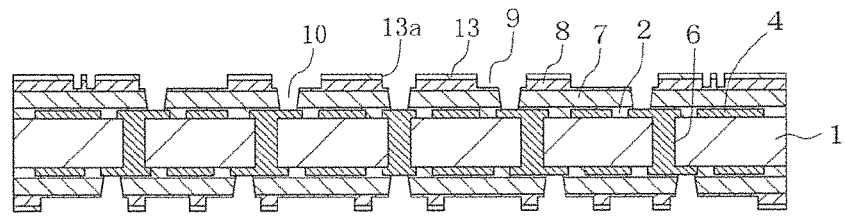

Next, as illustrated in FIG. 5H, the via hole 10 the bottom surface of which is the wiring conductor 4 positioned on the surface of the core insulating layer 1 is formed by, for example, irradiating a part of the bottom surface of the groove for wiring 9 with a laser beam.

Figure 5I:
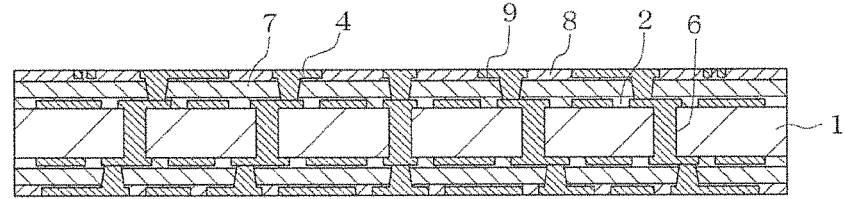

Next, as illustrated in FIG. 5I, the wiring conductor 4 is formed in the groove for wiring 9 and the via hole 10. The wiring conductor 4 is formed by depositing a copper-plating metal in the groove for wiring 9 and the via hole 10 by, for example, a semi-additive method and polishing the upper surface of the wiring conductor 4 and the upper surface of the second insulating layer 8 to be planarized and flush with each other.

Figure 5J:
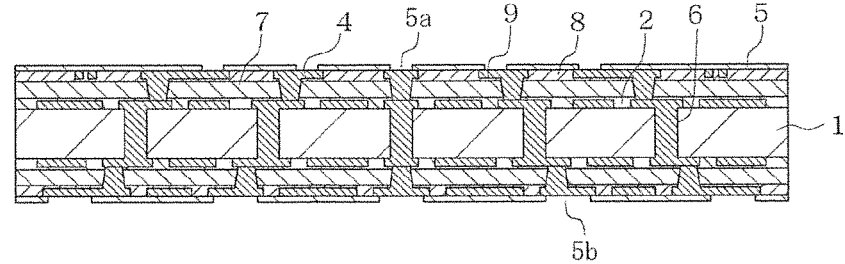

Finally, as illustrated in FIG. 5J, the solder resist 5 is formed on the surface of the second insulating layer 8 and the surface of the wiring conductor 4. The solder resist 5 is formed by, for example, causing a film of thermosetting resin having photosensitivity such as acrylic modified epoxy resin to adhere to the surface of the second insulating layer 8, and forming and thermally curing the openings 5a and 5b by exposure and development. Thus, the wiring board 20 is formed.

As described above, according to the method for manufacturing a wiring board of the present disclosure, the bottom surface of the groove for wiring 9 for forming the wiring conductor 4 is formed in the second insulating layer 8 containing the second insulating particles 8f having the particle size smaller than the particle size of the first insulating particles 7f. Therefore, the bottom surface of the wiring conductor 4 formed in the groove for wiring 9 is unlikely to be affected by the irregularities caused by the second insulating particles 8f having a small particle size and is also unlikely to be affected by the irregularities caused by the first insulating particles 7f having a large particle size included in the first insulating layer 7, and therefore a flat bottom surface is formed. The cross section of the second insulating resin 8r and the cross section of the second insulating particles 8f are flatly formed so as to be flush with each other on the side surface of the groove for wiring 9. Therefore, the side surface of the wiring conductor 4 is flatly formed. The upper surface of the wiring conductor 4 is also flatly formed by the polishing described above. Therefore, the wiring board having a good transmission characteristic of a high frequency signal can be provided.

Figure 3:
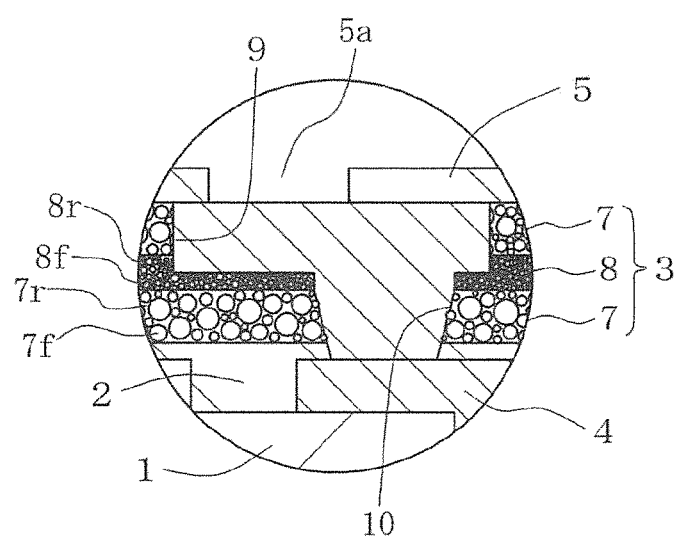
FIG. 3 is an enlarged sectional view of a main portion of a different exemplary embodiment of a wiring board of the present disclosure.

The present disclosure is not limited to an exemplary embodiment described above and various modifications are possible without departing from the gist of the present disclosure. For example, in an exemplary embodiment described above, the groove for wiring 9 is positioned only in the second insulating layer 8, but as illustrated in FIG. 3, the groove for wiring 9 may be positioned over the first insulating layer 7 and the second insulating layer 8. Such laminate 3 has a three-layer structure in which one layer of the second insulating layer 8 is sandwiched between two layers of the first insulating layers 7. Since the bottom surface of the groove for wiring 9 is also positioned in the second insulating layer 8, the bottom surface of the wiring conductor 4 positioned in the groove for wiring 9 is unlikely to be affected by the irregularities caused by the second insulating particles having a relatively small particle size and is also unlikely to be affected by the irregularities caused by the first insulating particles 7f included in the first insulating layer 7, and therefore it is easy to form a flat surface. The side surface and the upper surface of the wiring conductor 4 also form flat surfaces as described above. Therefore, the wiring board having a good transmission characteristic of a high frequency signal can be provided. If the number of layers of the first insulating layers 7 having a small thermal expansion coefficient is larger than the number of layers of the second insulating layers 8 having a large thermal expansion coefficient, it is advantageous in forming the wiring board having a small thermal expansion coefficient.

What is claimed is:

1. A wiring board comprising: a laminate in which at least one first insulating layer and at least one second insulating layer are alternately positioned, the at least one first insulating layer containing first insulating particles and a first insulating resin, the at least one second insulating layer containing second insulating particles having a particle size smaller than a particle size of the first insulating particles and a second insulating resin; a groove for wiring positioned at least on an upper surface of the laminate and comprising a side surface and a bottom surface; a via hole positioned in the first insulating layer of the laminate; and a wiring conductor positioned in the groove for wiring and in the via hole; where the bottom surface of the groove for wiring is positioned in the second insulating layer; and wherein the bottom surface of the groove for wiring is positioned in the second insulating layer, wherein the side surface of the groove for wiring is positioned only in the second insulating layer, and a cross section of the second insulating particles and a cross section of the second insulating resin are positioned to be flush with each other on the side surface.

2. A method for manufacturing a wiring board, comprising: preparing a first insulating layer containing first insulating particles and a first insulating resin, and a second insulating layer containing second insulating particles having a particle size smaller than a particle size of the first insulating particles and a second insulating resin; forming a laminate by alternately laminating at least one layer of the first insulating layer and at least one layer of the second insulating layer; forming a metal mask comprising an opening corresponding to a wiring pattern, on a surface of the laminate; forming a groove for wiring a bottom surface of which is positioned in the second insulating layer by etching the laminate exposed in the opening; forming a via hole penetrating the first insulating layer from an upper surface to a lower surface of the first insulating layer; and forming a wiring conductor in the groove for wiring and the via hole, wherein in the forming of the groove for wiring, a side surface of the groove for wiring is formed only in the second insulating layer, and a cross section of the second insulating particles and a cross section of the second insulating resin are formed to be flush with each other on the side surface.

3. A wiring board comprising: a laminate in which at least one first insulating layer and at least one second insulating layer are alternately positioned, the at least one first insulating layer containing first insulating particles and a first insulating resin, the at least one second insulating layer containing second insulating particles having a particle size smaller than a particle size of the first insulating particles and a second insulating resin; a groove for wiring positioned at least on an upper surface of the laminate and comprising a side surface and a bottom surface; a via hole positioned in the first insulating layer of the laminate; and a wiring conductor positioned in the groove for wiring and in the via hole; where the bottom surface of the groove for wiring is positioned in the second insulating layer, wherein the side surface of the groove for wiring is positioned over the first insulating layer and the second insulating layer positioned continuously, a cross section of the first insulating particles, a cross section of the first insulating resin, a cross section of the second insulating particles, and a cross section of the second insulating resin are positioned to be flush with each other on the side surface.

4. A method for manufacturing a wiring board, comprising: preparing a first insulating layer containing first insulating particles and a first insulating resin, and a second insulating layer containing second insulating particles having a particle size smaller than a particle size of the first insulating particles and a second insulating resin; forming a laminate by alternately laminating at least one layer of the first insulating layer and at least one layer of the second insulating layer; forming a metal mask comprising an opening corresponding to a wiring pattern, on a surface of the laminate; forming a groove for wiring a bottom surface of which is positioned in the second insulating layer by etching the laminate exposed in the opening; forming a via hole penetrating the first insulating layer from an upper surface to a lower surface of the first insulating layer; and forming a wiring conductor in the groove for wiring and the via hole, wherein in the forming of the groove for wiring, a side surface of the groove for wiring is formed over the first insulating layer and the second insulating layer continuously positioned, and a cross section of the first insulating particles, a cross section of the first insulating resin, a cross section of the second insulating particles, and a cross section of the second insulating resin are formed to be flush with each other on the side surface.

* * * * *